United States Patent
Hassel et al.

(10) Patent No.: US 12,009,789 B2
(45) Date of Patent: Jun. 11, 2024

(54) CRYOGENIC INTEGRATED CIRCUIT, INTEGRATED MODULE, AND ARRANGEMENT FOR PRODUCING AND DETECTING EXCITATION AND READOUT SIGNALS OF QUBITS

(71) Applicant: IQM Finland Oy, Espoo (FI)

(72) Inventors: Juha Hassel, Espoo (FI); Pasi Lähteenmäki, Espoo (FI)

(73) Assignee: IQM Finland Oy, Espoo (FI)

( * ) Notice: Subject to any disclaimer, the term of this patent is extended or adjusted under 35 U.S.C. 154(b) by 868 days.

(21) Appl. No.: 17/081,271

(22) Filed: Oct. 27, 2020

(65) Prior Publication Data
US 2021/0305958 A1 Sep. 30, 2021

(30) Foreign Application Priority Data
Mar. 24, 2020 (EP) .................................. 20165267

(51) Int. Cl.
| | |
|---|---|
| H03F 7/04 | (2006.01) |
| H03F 19/00 | (2006.01) |
| H03K 3/38 | (2006.01) |
| H01L 25/065 | (2023.01) |
| H01L 25/10 | (2006.01) |
| H10N 69/00 | (2023.01) |

(52) U.S. Cl.
CPC .............. *H03F 19/00* (2013.01); *H03K 3/38* (2013.01); *H01L 25/0657* (2013.01); *H01L 25/105* (2013.01); *H03F 2200/447* (2013.01); *H10N 69/00* (2023.02)

(58) Field of Classification Search
CPC ..... H03F 19/00; H03F 2200/447; H03K 3/38; H01L 25/0657; H01L 25/105; H10N 69/00; G06N 10/40; G06N 10/00; H03D 7/16
See application file for complete search history.

(56) References Cited

U.S. PATENT DOCUMENTS

| | | |
|---|---|---|
| 3,292,000 A | 12/1966 | Chow |
| 3,617,898 A | 11/1971 | Janning, Jr. |

(Continued)

FOREIGN PATENT DOCUMENTS

| | | |
|---|---|---|
| AU | 2018221879 | 10/2019 |
| EP | 3863178 | 8/2021 |
| FI | 20195189 | 9/2020 |

OTHER PUBLICATIONS

International Search Report issued to PCT/FI2021/050195, dated Sep. 2, 2021, 3 pages.

(Continued)

*Primary Examiner* — Khanh V Nguyen
(74) *Attorney, Agent, or Firm* — Meunier Carlin & Curfman LLC

(57) ABSTRACT

A cryogenic integrated circuit or integrated module includes a travelling wave parametric amplifier or a Josephson parametric amplifier. The cryogenic integrated circuit or integrated module also includes an oscillator, a signal input, a biasing input, and a signal output. The oscillator is connected to an input of the amplifier and is configured to produce an oscillating drive signal. The signal input couples input signals into the amplifier. The biasing input couples biasing signals into the oscillator. The signal output conveys output signals from the amplifier out of the cryogenic integrated circuit or integrated module.

24 Claims, 6 Drawing Sheets

(56) References Cited

U.S. PATENT DOCUMENTS

| 10,903,809 | B2* | 1/2021 | White | H03F 19/00 |
| 10,985,701 | B1* | 4/2021 | Abdo | H03D 7/005 |
| 2022/0188683 | A1* | 6/2022 | Goetz | H01P 1/22 |

OTHER PUBLICATIONS

Miano et al., "Symmetric Traveling Wave Parametric Amplifier"; IEEE Transactions on Applied Superconductivity, vol. 29, No. 5, Aug. 2019, 6 pages.
Van Dijk et al., "The electronic interface for quantum processors"; Microprocessors and Microsystems, online journal—www.elsevier.com/locate/micropro; Feb. 21, 2019, 90 pages.

* cited by examiner

CRYOGENIC INTEGRATED CIRCUIT, INTEGRATED MODULE, AND ARRANGEMENT FOR PRODUCING AND DETECTING EXCITATION AND READOUT SIGNALS OF QUBITS

PRIORITY CLAIM

This application claims priority to European Patent Application No. 20165267.4, filed on Mar. 24, 2020, the entire disclosure of which is incorporated by reference herein.

TECHNICAL FIELD

The invention is generally related to quantum computing, in which excitation signals are directed to qubits and qubit output signals are extracted and trans-mitted for signal processing. In particular, the invention is related to the way in which qubit excitation signals are generated and the way in which the various frequency conversions are made in quantum computing systems.

BACKGROUND

Quantum computing involves the task of directing carefully generated excitation signals to excite qubits in order to implement quantum computing operations. In typical solid-state qubits, such as superconducting qubits, carrier frequencies of excitation signals are on the order of several GHz, even if the information bandwidth is only a fraction thereof. The quantum computing circuits can only be operated in extremely low temperatures, which means temperatures well below 1 Kelvin (K), so advanced cryostats must be used.

FIG. 1 illustrates a known arrangement for producing excitation signals for qubits in a room temperature environment. A carrier wave generator (CWG) 101 generates a carrier wave signal, the frequency of which may be for example between 5 and 10 GHz. An arbitrary wave generator (AWG) 102 generates a waveform that conveys the desired information, using a much lower frequency. The carrier wave and the information waveform are mixed together in a mixer 103, operated as an up-converter. A signal line 104 carries the resulting excitation signal from the room temperature environment to a cryogenically cooled environment.

The approach shown in FIG. 1 works reasonably well as long as there are only a limited number of qubits for which the excitation signals need to be generated. However, as the technology of quantum circuits becomes more mature and approaches the limit where quantum computing could truly surpass classical computing in performance, quantum circuits with more and more qubits are being developed. The technological requirements of limited cooling power at sub-Kelvin temperatures on one hand and high-frequency connectivity between room temperature control electronics on the other hand lead to certain complicated and cumbersome design issues. This manifests itself as high power consumption by thermal loading and signal dissipation in a signal path from room temperature to a cryogenic environment. Further, these known systems require a large physical space, which eventually limits the scalability of quantum computing infrastructure. A noteworthy factor is, however, that the information bandwidth needed in the qubit control is significantly lower than the bandwidth needed between the room temperature and cryogenic stages in the conventional arrangement of FIG. 1. It would be much simpler to convey, to the cryostat, signals that are at frequencies in the range of the AWG output than those in the several GHz range.

SUMMARY

It is an objective to provide a method, a system, and an arrangement for producing excitation signals for qubits in a way that enables simpler hardware implementation at the interface between room temperature and cryogenically cooled environments. Another objective is to produce excitation signals that require a more limited heat load to a cryostat. A further objective is to produce excitation signals for qubits at versatile frequencies. A yet further objective is to provide considerable design freedom for a hardware interface that provides for exciting qubits.

The objectives of the invention are achieved by utilizing a particular kind of amplifier as a mixer. The amplifier disclosed herein is configured to perform up-conversion of excitation signals inside a cryogenically cooled environment.

According to a first aspect there is provided a cryogenic integrated circuit or integrated module. The cryogenic integrated circuit or integrated module comprises an amplifier, which includes a travelling wave parametric amplifier or a Josephson parametric amplifier. The amplifier includes at least one amplifier input and an amplifier output. The cryogenic integrated circuit or integrated module also includes an oscillator configured to produce an oscillating drive signal. The oscillator is connected to the at least one amplifier input for coupling the oscillating drive signal into the amplifier. The cryogenic integrated circuit or integrated module further includes a signal input configured to couple input signals into the amplifier through the at least one amplifier input, a biasing input configured to couple biasing signals into the oscillator, and a signal output configured to convey output signals from the amplifier output out of the cryogenic integrated circuit or integrated module.

According to an embodiment the cryogenic integrated circuit or integrated module comprises a directional coupler or power combiner with a first coupler input, a second coupler input, and a coupler output. The first coupler input is coupled to the signal input, the second coupler input is coupled to the oscillator, and the coupler output is coupled to the at least one amplifier input. This provides an advantage by enabling the amplifier to be fed with a combined input signal comprising both an information carrying signal and an oscillating drive signal, with all of the components being located or implemented on the same cryogenic integrated circuit or integrated module.

According to an embodiment, the at least one amplifier input includes an amplifier signal input and an amplifier drive input. In such a case, the signal input may couple the input signals into the amplifier through the amplifier signal input. Additionally, the oscillator may couple the oscillating drive signal into the amplifier drive input. This provides an advantage by enabling the amplifier to be fed with an information carrying signal and a separate oscillating drive signal, if needed.

According to an embodiment, the cryogenic integrated circuit or integrated module further includes a clock reference input configured to couple reference clock signals into the oscillator. This provides an advantage by enabling the oscillator (which itself is located within the cryogenic integrated circuit or integrated module) to be controlled with external reference clock signals.

According to an embodiment, the cryogenic integrated circuit or integrated module further includes a frequency multiplier coupled between the reference clock input and the oscillator. This provides an advantage by enabling the external reference clock signals to be brought in from an external source at a more advantageous, lower frequency.

According to an embodiment, the cryogenic integrated circuit or integrated module further includes a band-pass filter coupled between the frequency multiplier and the oscillator. This provides an advantage by enabling the reference clock signal to be brought into the oscillator at an elevated frequency that is in a clean, strictly defined form.

According to an embodiment, the amplifier and the oscillator are monolithically integrated onto a common substrate. This provides an advantage by providing a very high degree of integration so that a relatively complete cryogenic chip can be manufactured in a single process.

According to an embodiment, the frequency multiplier is monolithically integrated onto the common substrate together with the amplifier and the oscillator. This provides an advantage by providing a very high degree of integration so that a relatively complete cryogenic chip can be manufactured in a single process.

According to an embodiment, the frequency multiplier and the band-pass filter are monolithically integrated onto the common substrate together with the amplifier and the oscillator. This is advantageous by providing a very high degree of integration so that a relatively complete cryogenic chip can be manufactured in a single process.

According to an embodiment, the amplifier is located on a first chip, the oscillator is located on a second chip, and the first and second chips are integrated together through a bonding method such as wire bonding or flip-chip-bonding. This is advantageous because the amplifier and oscillator can be obtained from dedicated manufacturing stages that can be separately optimized for the required characteristics of each chip.

According to an embodiment, the amplifier is located on a first chip, the oscillator is located on a second chip, and the first and second chips are separately packaged devices in a common functionally connected module that constitutes the cryogenic integrated circuit or integrated module. This is advantageous because the amplifier and oscillator can be obtained from dedicated manufacturing stages that can be separately optimized for the required characteristics of each chip.

According to an embodiment, the amplifier is a first amplifier, the at least one amplifier input is at least one first amplifier input, the amplifier output is a first amplifier output, the oscillator is a first oscillator, and the oscillating drive signal is a first oscillating drive signal. In this embodiment, the cryogenic integrated circuit or integrated module further includes a second amplifier including a travelling wave parametric amplifier or a Josephson parametric amplifier. The second amplifier includes at least one second amplifier input and a second amplifier output. The cryogenic integrated circuit or integrated module also includes a second oscillator configured to produce a second oscillating drive signal. The second oscillator is connected to the at least one second amplifier input for providing the second oscillating drive signal into the second amplifier. The first amplifier output is coupled to the at least one second amplifier input and the second amplifier output is coupled to the signal output. This is advantageous because more extensive frequency conversions can be obtained in a chain of concatenated amplifiers, all within the same cryogenic integrated circuit or integrated module.

According to an embodiment, the amplifier is a first amplifier, the at least one amplifier input is at least one first amplifier input, the amplifier output is a first amplifier output, the signal input is a first signal input, and the input signals are first input signals. In this embodiment, the cryogenic integrated circuit or integrated module further includes a second amplifier including a travelling wave parametric amplifier or a Josephson parametric amplifier. The second amplifier includes at least one second amplifier input and a second amplifier output. The cryogenic integrated circuit or integrated module also includes a power divider or directional coupler configured to divide the oscillating drive signal into both the at least one first amplifier input and the at least one second amplifier input. This is advantageous because the two amplifiers within the same cryogenic integrated circuit or integrated module may share oscillating drive signals from a common oscillator, which is also part of the same cryogenic integrated circuit or integrated module.

According to an embodiment, the cryogenic integrated circuit or integrated module further includes a second signal input configured to couple second input signals into the second amplifier through the at least one second amplifier input, and a power combiner including a first combiner input, a second combiner input, and a combiner output. The first amplifier output is coupled to the first combiner input, the second amplifier output is coupled to the second combiner input, and the combiner output is coupled to the signal output. This is advantageous because the signals from the two parallel amplifiers may be combined within the cryogenic integrated circuit or integrated module.

According to an embodiment, the oscillator is a first oscillator and the oscillating drive signal is a first oscillating drive signal. In this embodiment, the cryogenic integrated circuit or integrated module further includes a second oscillator configured to produce a second oscillating drive signal. Each of the first amplifier and the second amplifier includes a two-stage cascaded amplifier where each stage is a travelling wave parametric amplifier or a Josephson parametric amplifier. The first oscillator is configured to convey the first oscillating drive signal to first stages of each of the first and second amplifiers, and the second oscillator is configured to convey the second oscillating drive signal to second stages of each of the first and second amplifiers. This is advantageous because beneficial features of both cascaded amplifier chains and parallel amplifiers can be utilized within the same cryogenic integrated circuit or integrated module.

According to an embodiment, the signal output is a first signal output and the output signals are first output signals. In this embodiment, the cryogenic integrated circuit or integrated module further includes a second signal output configured to convey second output signals from the second amplifier output. This is advantageous because outputs from the cryogenic integrated circuit or integrated module can be conveyed to different sections in the system.

According to an embodiment, the signal output is configured to convey the output signals from the amplifier output out on an idler frequency of the respective travelling wave parametric amplifier or the Josephson parametric amplifier. This is advantageous because the travelling wave parametric amplifier or the Josephson parametric amplifier can be used as a frequency converter, which gives more freedom in selecting the other frequency levels in the system.

According to a second aspect, there is provided a system for generating excitation signals for qubits in a cryogenically cooled environment. The system includes at least one cryogenic integrated circuit or integrated module that is located within the cryogenically cooled environment, a waveform generator that is located outside the cryogenically cooled environment, and a signal line connected to the waveform generator and a signal input of the cryogenic integrated circuit or integrated module. The cryogenic integrated circuit or integrated module includes an amplifier including a travelling wave parametric amplifier or a Josephson parametric amplifier, the amplifier comprising at least one amplifier input and an amplifier output. The cryogenic integrated circuit or integrated module also includes an oscillator configured to produce an oscillating drive signal. The oscillator is connected to the at least one amplifier input for providing the oscillating drive signal into the amplifier. The cryogenic integrated circuit or integrated module further includes the signal input configured to couple input signals into the amplifier through the at least one amplifier input, a biasing input configured to couple biasing signals into the oscillator, and a signal output configured to convey output signals from the amplifier output out of the cryogenic integrated circuit or integrated module.

According to an embodiment, the waveform generator is configured to generate waveforms at frequencies smaller than 2.5 GHz, and convey the waveforms into the signal line. This is advantageous because building signal line connections between the room temperature environment and the cryogenically cooled environment is significantly simpler for lower frequencies than with higher frequencies.

According to an embodiment, the system further includes a DC bias source located outside the cryogenically cooled environment, and a DC bias line connected to the DC bias source and a DC biasing input of the cryogenic integrated circuit or integrated module, or first and second DC bias lines connected to the DC bias source and respective DC biasing inputs of the cryogenic integrated circuit or integrated module. This is advantageous because DC biasing signals can be utilized in controlling the circuitry within the cryogenically cooled environment.

According to an embodiment, the system further includes a clock reference source located outside the cryogenically cooled environment, and a clock reference line connected to the clock reference source and a clock reference input of the oscillator, or first and second clock reference lines connected to the clock reference source and respective clock reference inputs of the oscillator and a second oscillator. This is advantageous because reference clock signals can be utilized in controlling the circuitry within the cryogenically cooled environment.

According to a third aspect, there is provided a system for extracting qubit output signals from a quantum computing system located in a cryogenically cooled environment. The system includes at least one cryogenic integrated circuit or integrated module within the cryogenically cooled environment, a coupling from the quantum computing system into a signal input of the cryogenic integrated circuit or integrated module, and a signal line connected to a signal output of the cryogenic integrated circuit or integrated module through a cryogenic preamplifier to a processing system outside the cryogenically cooled environment. The cryogenic integrated circuit or integrated module includes an amplifier including a travelling wave parametric amplifier or a Josephson parametric amplifier, the amplifier comprising at least one amplifier input and an amplifier output. The cryogenic integrated circuit or integrated module also includes an oscillator configured to produce an oscillating drive signal. The oscillator is connected to the at least one amplifier input for providing the oscillating drive signal into the amplifier. The cryogenic integrated circuit or integrated module further includes the signal input configured to couple input signals into the amplifier through the at least one amplifier input, a biasing input configured to couple biasing signals into the oscillator, and the signal output configured to convey output signals from the amplifier output out of the cryogenic integrated circuit or integrated module.

According to an embodiment, the signal output is configured to convey the output signals from the amplifier output out of the cryogenic integrated circuit or integrated module on an idler frequency of the respective travelling wave parametric amplifier or the Josephson parametric amplifier. The idler frequency is smaller than a frequency of the qubit output signals from the quantum computing system. This is advantageous because frequency down-conversion characteristics of the amplifier(s) can be utilized to bring the frequencies of the output signals to more advantageous levels.

According to an embodiment, the signal output is configured to convey the output signals from the amplifier output out of the cryogenic integrated circuit or integrated module on an output frequency of the respective travelling wave parametric amplifier or the Josephson parametric amplifier. The output frequency is the same as a frequency of the qubit output signals from the quantum computing system. This is advantageous because minimal distortion and maximal amplification affects the output signals.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 1:
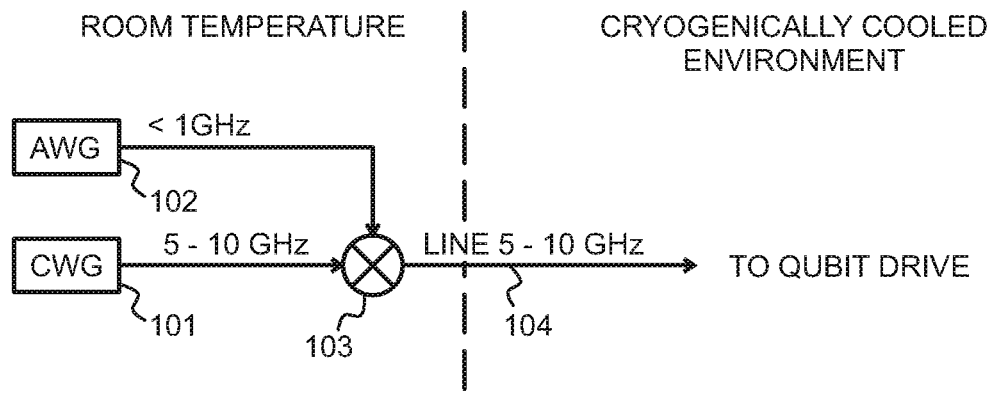
FIG. 1 illustrates a known arrangement for producing excitation signals for qubits.
Figure 2:
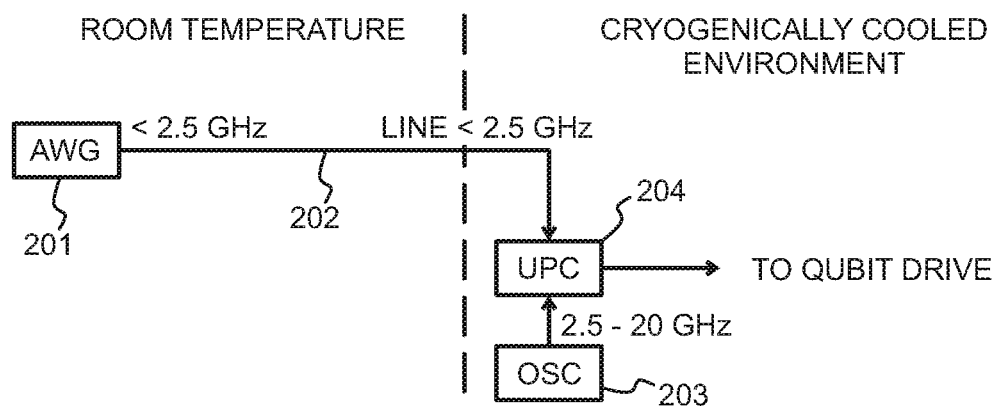
FIG. 2 illustrates an example embodiment of producing excitation signals for qubits.

FIG. 2 illustrates, on a higher level of abstraction, an arrangement for producing excitation signals for qubits. Like FIG. 1, in FIG. 2 there is a room temperature environment (to the left of the vertical dashed line) and a cryogenically cooled environment (to the right of the dashed line). As an example, the cryogenically cooled environment may be located inside a cryostat that itself is located in the room temperature environment. The designation "room temperature" should not be taken as a limitation that would necessarily require the environmental conditions in the room temperature environment correspond to those rooms where people live and work. It is more an indication that the conditions to the left in FIG. 2 do not require cryogenic cooling to the temperatures found in the cryogenically cooled environment. The environmental conditions in the cryogenically cooled environment may include an extremely low temperature, such as only a few Kelvins or even considerably less than one Kelvin, such as on the order of millikelvins. The lowest temperature may exist in only a part of the cryogenically cooled environment, as there may be cooled stages of progressively lower temperatures. Disclosing that some part of the system is located within the cryogenically cooled environment does not limit the disclosed part to any particular stage of the environment. The environmental conditions in the cryogenically cooled environment may also include a high vacuum since a surrounding high vacuum is typically needed as thermal insulation for maintaining the low temperatures needed for the environment.

FIG. 2 shows a waveform generator 201 located outside the cryogenically cooled environment, in the room temperature environment. The waveform generator 201 is configured to convey waveforms at frequencies smaller than 2.5 GHz through a signal line 202 into the cryogenically cooled environment. In an advantageous embodiment, the frequencies of the waveforms conveyed through the signal line 202 may be smaller than 1.5 GHz. These waveforms are configured to carry information for use in qubit control (also known as qubit drive) into the cryogenically cooled environment. Compared to previous solutions, such as the solution shown in FIG. 1, lower frequencies may provide freedom in designing the signal cabling and wiring. The use of lower frequencies may allow for a smaller cross section of electrically con-ducting material, thereby leading to lower thermal loading and reduced cooling needs. It is also easier to design the cabling allowing for larger densities in connectivity, which provides for higher data rates per footprint area.

In the example of FIG. 2, an oscillator 203 is located within the cryogenically cooled environment. The oscillator 203 is configured to produce an oscillating drive signal at a frequency high enough to be used in controlling (or driving) qubits in the cryogenically cooled environment. The frequency of the oscillating drive signal produced by the oscillator 203 may be, for example, in the range between 2.5 GHz and 20 GHz, depending on the characteristic frequencies involved in the qubits and their supporting circuitry.

Also, as shown in FIG. 2, a circuit element 204 is located in the cryogenically cooled environment. The circuit element 204 is used to produce the actual qubit drive signals from the waveforms received from the waveform generator 201 and the oscillating drive signals received from the oscillator 203. Advantageous embodiments of circuit elements and their combinations that may take the role of the circuit element 204 are described in more detail below.

Figure 3:
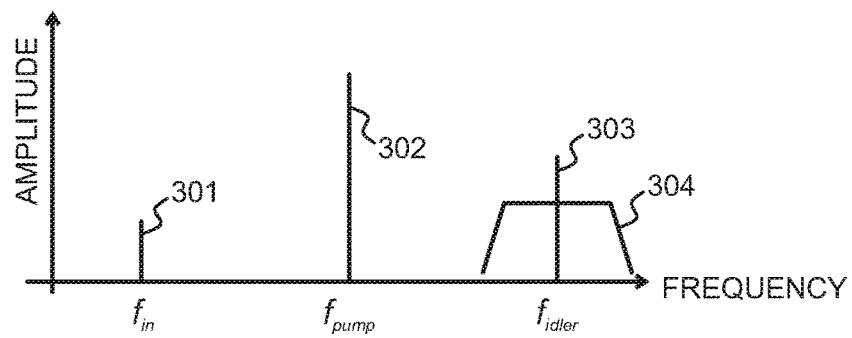
FIG. 3 illustrates an example of frequencies involved in the use of a travelling wave parametric amplifier.
Figure 4:
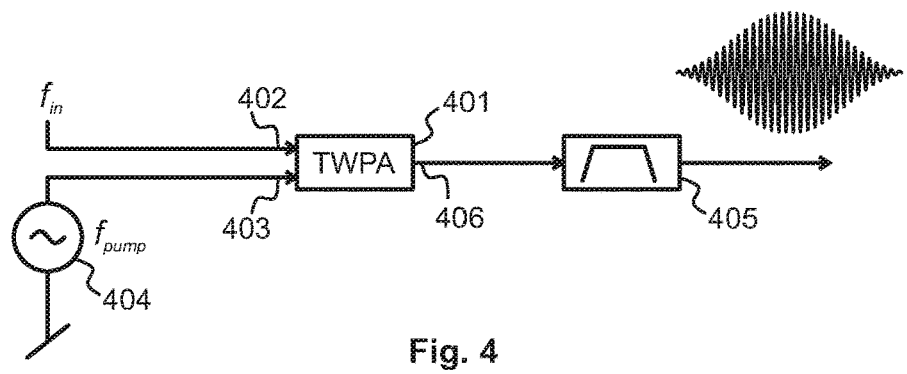
FIG. 4 illustrates an example embodiment of using a travelling wave parametric amplifier and a filter.

FIGS. 3 and 4 illustrate some characteristics of using a travelling wave parametric amplifier (TWPA) or a Josephson parametric amplifier in a combination of circuit elements that may take the role of the circuit element 204 illustrated schematically in FIG. 2. While a travelling wave parametric amplifier may be considered a subcategory of all Josephson parametric amplifiers, those operational characteristics that have significance for the following description are common to all Josephson parametric amplifiers. For keeping expressions short, the acronym TWPA is used herein for any travelling wave parametric amplifier or Josephson parametric amplifier.

As shown in FIG. 3, it is characteristic of a TWPA to receive an input signal at an input frequency $f_{in}$ and receive a pumping signal at a pumping frequency $f_{pump}$, which is higher than the input frequency $f_{in}$. A simplified notation is used herein in which the input signals are referred to by the frequency notation $f_{in}$, denoting the input signals as single-frequency components. In all illustrations described herein, it is assumed, unless otherwise stated, that the input signals are waveforms with time-domain controlled properties containing signal information, and thus have a finite bandwidth. The pumping signal may also be called an oscillating drive signal. An amplified output signal of the TWPA occurs at the input frequency $f_{in}$, as represented by column 301 in FIG. 3 (the amplifier input signal is not shown in FIG. 3). In a TWPA, the power corresponding to the pump signal $f_{pump}$ (the higher amplitude column 302 in FIG. 3) is partially converted into an idler frequency $f_{idler}$ 303, carrying the same information as $f_{in}$, but located as a mirror image thereof with respect to the pumping frequency $f_{pump}$. Also, the idler signal can be amplified with respect to the input signal. A beneficial feature of a TWPA is the relatively wide bandwidth so that $f_{idler}$ can be at a significantly higher frequency than $f_{pump}$.

If in an application additional frequency components from the signal need to be rejected or otherwise removed, it is possible to select the desired output frequency from the TWPA by using a suitable filter, such as a band-pass filter or a high-pass filter, at its output. In FIG. 3 the pass band 304 of a band-pass filter is schematically shown centered on the idler frequency $f_{idler}$. Such an arrangement would mean that instead of the amplified output signal at the input frequency $f_{in}$, the idler signal at the idler frequency $f_{idler}$ is utilized as the desired output frequency from the TWPA.

FIG. 4 shows a TWPA 401 with first and second amplifier inputs 402 and 403. Input signals provided at an input signal frequency $f_{in}$ are coupled into the TWPA 401 through the first amplifier input 402. Pumping signals provided at the pumping frequency $f_{pump}$ are coupled into the TWPA 401 through the second amplifier input 403. Some TWPA types are designed so that the input and pumping signals can be coupled into the TWPA through a common input, so the provision of separate first and second amplifier inputs in this and other presented embodiments is only an illustrated example. The provision of more than two amplifier inputs is not excluded either. In the general case, a TWPA may comprise at least one amplifier input, so that the input signal and the pumping signal (or oscillating drive signal) are coupled into the TWPA through the at least one amplifier input. The input through which the input signal is received may be called an amplifier signal input. Additionally, the input through which the pumping signal is received may be called an amplifier drive input.

The system or arrangement shown in FIG. 4 comprises an oscillator 404 that is configured to produce the pumping signal (or oscillating drive signal) at the pumping frequency $f_{pump}$. The input signals at the input signal frequency $f_{in}$ may come from a signal input of a cryogenic integrated circuit or integrated module, parts of which include the TWPA 401 and the oscillator 404. Also, FIG. 4 shows a band-pass filter 405 that is coupled to an amplifier output 406 of the TWPA, which may be part of the same cryogenic integrated circuit or integrated module. On the right is schematically shown an example of how an output signal of the TWPA 401 may appear after passing through the band-pass filter 405. The carrier frequency manifests itself as the fast oscillation in FIG. 4, and the amplitude envelope and phase follow a waveform that the TWPA received as an input signal through the first signal input 402.

Figure 5:
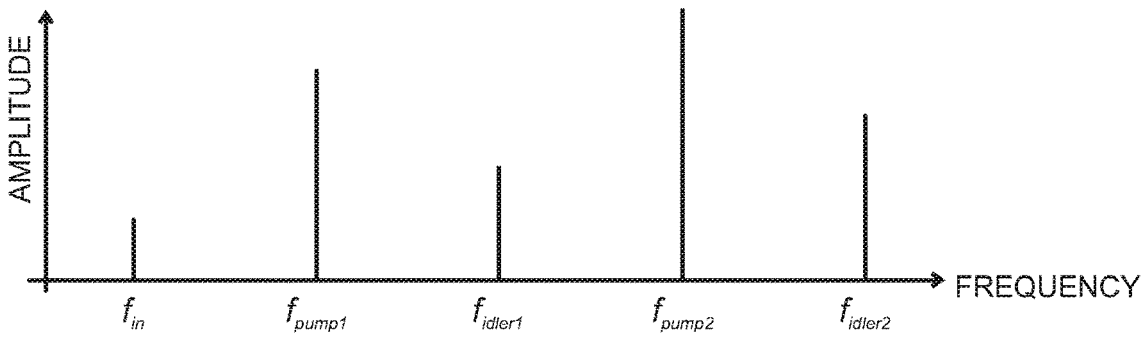
FIG. 5 illustrates an example of frequencies involved in the use of two cascaded travelling wave parametric amplifiers.
Figure 6:
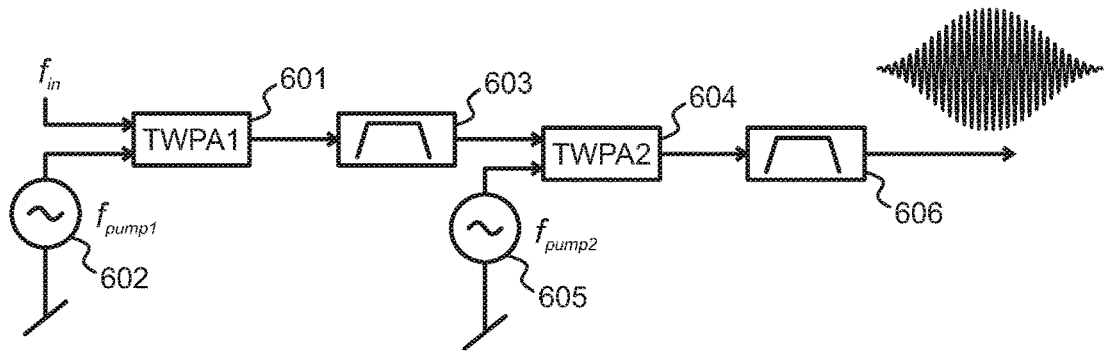
FIG. 6 illustrates an example embodiment of using two cascaded travelling wave parametric amplifiers and a filter.

In some cases, a desired frequency conversion may be more extensive than what can be achieved with a single TWPA. In such a case, it is possible to chain TWPAs so that the filtered output signal of a first TWPA serves as an input signal to a second TWPA. If the frequencies are selected in a suitable way, it is possible to utilize chained TWPAs of this kind, optimized for different frequency bands, to produce increasingly higher output frequencies. FIGS. 5 and 6 show an example in which the pumping frequency $f_{pump1}$ of the first TWPA 601, received from a first oscillator 602, is higher than the input frequency $f_{in}$ of the first TWPA 601. This means that one of the output frequencies of the first TWPA 601 is an idler frequency $f_{idler1}$ that is a mirror image of the input frequency $f_{in}$ on the other side of the pumping frequency $f_{pump1}$. A first band-pass filter 603 is used to select the idler frequency $f_{idler1}$ of the first TWPA 601 as the input signal frequency for the second TWPA 604, which receives an even higher frequency as its pumping frequency $f_{pump2}$ from a second oscillator 605.

As shown in FIG. 6, a second band-pass filter 606 is used to select the idler frequency $f_{idler2}$ of the second TWPA 604 as the output signal frequency of the chained TWPA arrangement. The output signal of the chained TWPA arrangement has a carrier frequency, shown as the fast oscillation in the illustration on the right in FIG. 6. The carrier frequency is within the pass band of the second band-pass filter 606. The envelope curve of the output signal follows a waveform that the first TWPA 601 received as an input signal through its first signal input.

Figure 7:
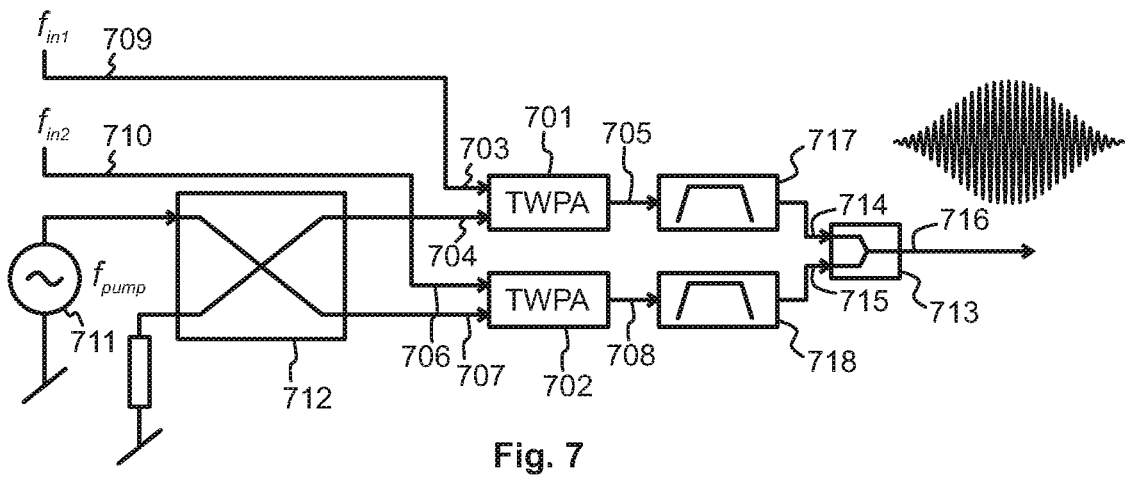
FIG. 7 illustrates an example embodiment of using travelling wave parametric amplifiers and filters in a configuration that combines two frequency or phase components.
Figure 8:
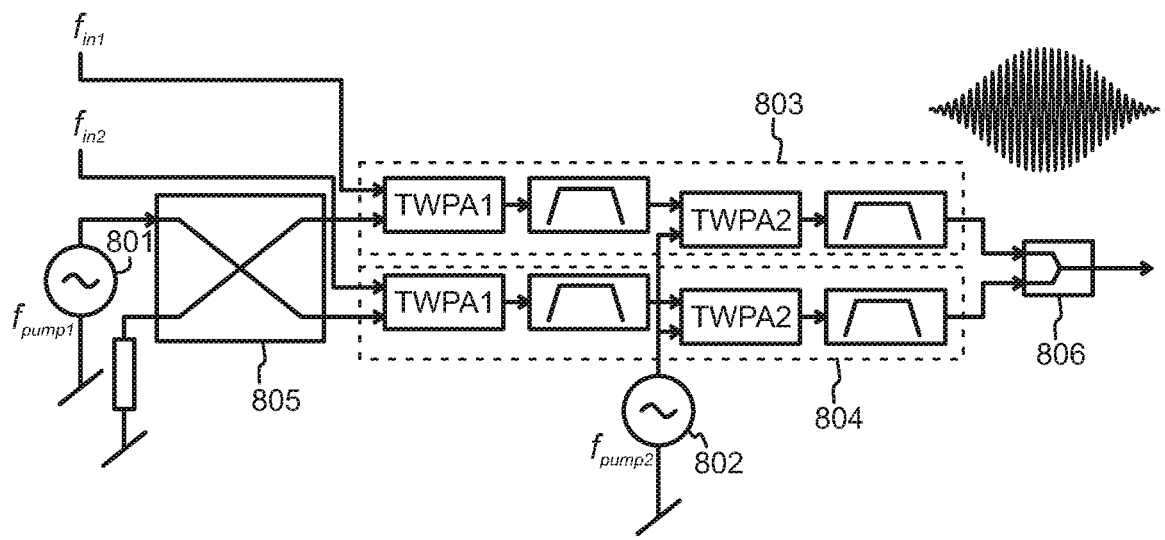
FIG. 8 illustrates an example embodiment of using two travelling wave parametric amplifier and filter stages in a configuration that combines two frequency or phase components.
Figure 9:
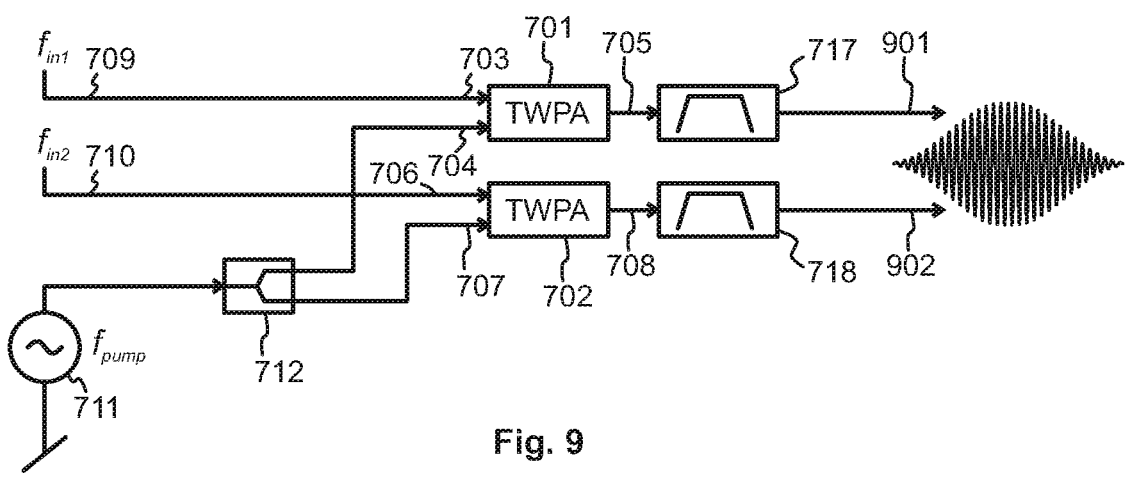
FIG. 9 illustrates an example embodiment of utilizing a common pumping frequency in two parallel branches that produce excitation signals for qubits.

FIGS. 7 to 9 illustrate some of the other possibilities of utilizing two or more TWPAs in a cryogenic integrated circuit or integrated module. In general, a cryogenic integrated circuit or integrated module is an apparatus in which circuit elements, designed for operation at cryogenic temperatures, are built together using one or more techniques of integration. Examples of such techniques are described in more detail below.

Noting that a TWPA requires an oscillating drive signal, a cryogenic integrated circuit or integrated module may have various combinations of oscillators and TWPAs. According to one example embodiment, a cryogenic integrated circuit or integrated module may comprise a first TWPA and a second TWPA. If there is a particular signal input to the cryogenic integrated circuit or integrated module, it may be configured to couple input signals into the first TWPA through its amplifier input. The cryogenic integrated circuit or integrated module may then comprise a power divider or directional coupler configured to divide an oscillating drive signal from a common oscillator into amplifier inputs of both the first and the second TWPAs. As an alternative, there may be two oscillators in the cryogenic integrated circuit or integrated module, each providing the oscillating drive signal into an amplifier input of its own dedicated TWPA.

In the embodiment of FIG. 7, the illustrated system includes a first TWPA 701 and a second TWPA 702. The TWPAs 701 and 702 are provided in a parallel configuration. Inputs of the first TWPA 701 comprise a first amplifier signal input 703 and a first amplifier drive input 704. Further, the first TWPA 701 has a first amplifier output 705. Inputs of the second TWPA 702 comprise a second amplifier signal input 706 and a second amplifier drive input 707. The second TWPA 702 has a second amplifier output 708. The cryogenic integrated circuit or integrated module includes a first signal input 709 and a second signal input 710, which are configured to couple input signals at frequencies $f_{in1}$ and $f_{in2}$ to the amplifier signal inputs 703 and 706 of the first and second TWPAs 701 and 702 respectively.

The cryogenic integrated circuit or integrated module of FIG. 7 includes an oscillator 711 configured to produce an oscillating drive signal at the frequency $f_{pump}$, and a power divider or directional coupler 712 configured to divide the oscillating drive signal into the first amplifier drive input 704 of the first TWPA 701 and the second amplifier drive input 707 of the second TWPA 702. Additionally, the cryogenic integrated circuit or integrated module of FIG. 7 includes a power combiner 713 with a first combiner input 714, a second combiner input 715, and a combiner output 716. The first amplifier output 705 is coupled, through a first band-pass filter 717, to the first combiner input 714. The second amplifier output 708 is coupled, through a second band-pass filter 718, to the second combiner input 715.

The embodiment of FIG. 7 can be beneficial if there is a need to combine the signals from two different sources. Combining signals this way may be beneficial with respect to the signal generator in case its signal generation capabilities of the input signals $f_{in1}$, and $f_{in2}$ are limited. For example, if the input signals $f_{in1}$, and $f_{in2}$ are strictly limited to a single frequency with a tunable amplitude but no controllable phase, such that $f_{in1}=f_{in2}$, one can use the combination to realize arbitrary phase control. Another application is to form signals as combinations of two frequencies if $f_{in1} \neq f_{in2}$, which may be beneficial, for example, in some applications involving multiplexing.

FIG. 8 shows how the cascaded embodiment of FIG. 6 and the parallel embodiment of FIG. 7 can be combined. The cryogenic integrated circuit or integrated module of FIG. 8 includes a first oscillator 801 configured to produce a first oscillating drive signal at a first pumping frequency $f_{pump1}$, and second oscillator 802 configured to produce a second oscillating drive signal at a second pumping frequency $f_{pump2}$. Each of the first and second amplifiers 803 and 804 is a two-stage cascaded amplifier where each stage is a TWPA. The first oscillator 801 is configured to convey the first oscillating drive signal to first stages of each of the first and second amplifiers 803 and 804, and the second oscillator 802 is configured to convey the second oscillating drive signal to second stages of each of the first and second amplifiers 803 and 804.

A power divider or directional coupler 805 is used to direct the first oscillating drive signal from the first oscillator 801 to the first stages of the first and second amplifiers 803 and 804. In other embodiments, another power divider or directional coupler could be used in association with the second oscillator 802. Coupling the two input signals at frequencies $f_{in1}$, and $f_{in2}$ to the amplifier signal inputs of the respective first stages in amplifiers 803 and 804, and coupling the outputs of the respective second stages of the amplifiers 803 and 804 together through a power combiner 806 follows the pattern described above in connection with FIG. 7.

FIG. 9 illustrates a cryogenic integrated circuit or integrated module in which two parallel TWPAs share a common source for their oscillating drive signal. The coupling and configuration of a the first and second TWPAs 701 and 702, the oscillator 711, and the power divider or directional coupler 712 are the same as described in connection with FIG. 7. However, the output signals from the first amplifier output 705 and the second amplifier output 708 are not combined. Instead, the output signals from the first amplifier output 705 and the second amplifier output 708 are individually coupled respectively, via respective band-pass filters 717 or 718, to a first signal output 901 or a second signal output 902 of the cryogenic integrated circuit or integrated module.

Figure 10:
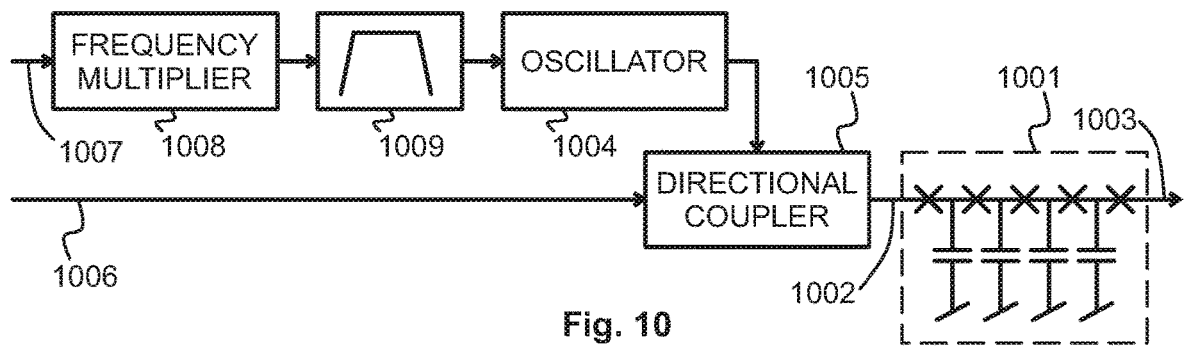
FIG. 10 illustrates parts of a cryogenic integrated circuit.

FIG. 10 illustrates an example embodiment of a cryogenic integrated circuit or integrated module. It comprises an amplifier 1001, which includes a travelling wave parametric amplifier or a Josephson parametric amplifier. In this example, the amplifier 1001 may include a TWPA. The amplifier 1001 includes an amplifier input 1002 and an amplifier output 1003. An oscillator 1004 is configured to produce an oscillating drive signal. The oscillator 1004 is connected to the amplifier input 1002 for coupling the oscillating drive signal into the amplifier 1001. In this embodiment, the cryogenic integrated circuit or integrated module also includes a power combiner or directional coupler 1005 with first and second coupler inputs and a coupler output. A signal input 1006 of the cryogenic integrated circuit or integrated module is coupled to the first coupler input. The oscillator 1004 is coupled to the second coupler input. The coupler output is coupled or connected to the amplifier input 1002 to combine the oscillating drive signal from the oscillator 1004 with the input signals from the signal input 1006. The amplifier output 1003 constitutes the signal output of the cryogenic integrated circuit or integrated module, i.e it is configured to convey output signals from the amplifier 1001 out of the cryogenic integrated circuit or integrated module.

There may be one or more control inputs to any oscillator that constitutes a part of the cryogenic integrated circuit or integrated module. In the embodiment of FIG. 10, the cryogenic integrated circuit or integrated module comprises a clock reference input 1007 configured to couple reference clock signals into the oscillator 1004. In the embodiment of FIG. 10, the cryogenic integrated circuit or integrated module comprises additionally a frequency multiplier 1008 coupled between the clock reference input 1007 and the oscillator 1004. An optional band-pass filter 1009 is shown coupled between the frequency multiplier 1008 and the oscillator 1004.

A cryogenic integrated circuit or integrated module according to FIG. 10 may exhibit various degrees of integration of its components. According to one embodiment, at least the amplifier 1001 and the oscillator 1004 are monolithically integrated onto a common substrate. According to another embodiment, the frequency multiplier 1008 is monolithically integrated onto the common substrate together with the amplifier 1001 and the oscillator 1004. According to another embodiment, the amplifier 1001 is located on a first chip, the oscillator 1004 is located on a second chip, and the first and second chips are integrated together through a bonding method such as wire bonding or flip-chip-bonding. According to another embodiment, the amplifier 1001 is located on a first chip, the oscillator 1004 is located on a second chip, and the first and second chips are separately packaged devices in a common functionally connected module that constitutes the cryogenic integrated circuit or integrated module.

Figure 11:
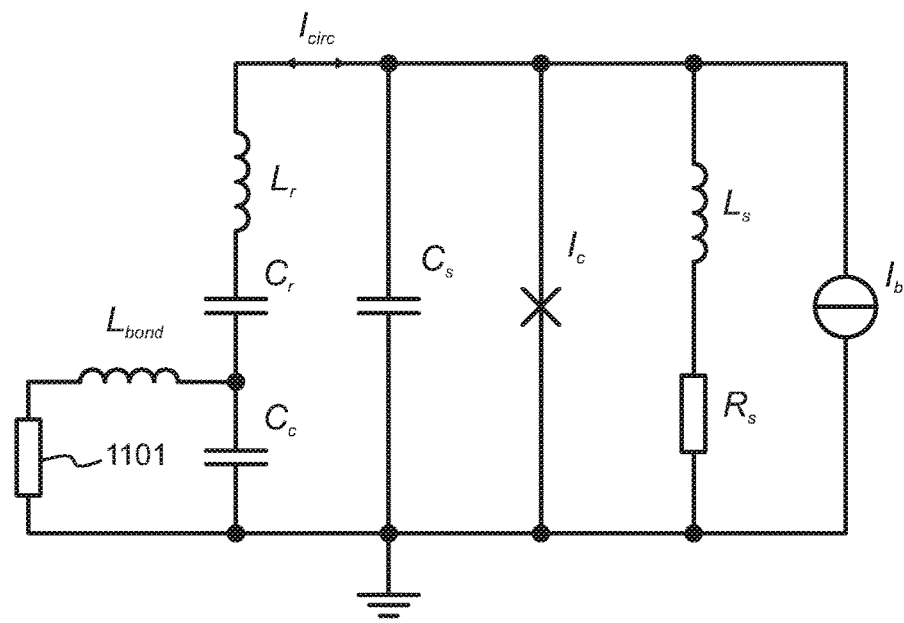
FIG. 11 illustrates an oscillator circuit based on the Josephson effect.

In preferred embodiments, the oscillator is based on the Josephson effect, and is commonly referred to as a Josephson oscillator or a Josephson laser. A benefit of this approach is its technological compatibility with the TWPA fabrication processes, often based on the Josephson effect as such, favoring the integrated approach. FIG. 11 illustrates an exemplary embodiment of a Josephson oscillator that can be used as any of the oscillators described herein. The disclosed configuration includes having at least one Josephson junction shunted by at least one resonator, referred to as the shunting resonator. There are many possible resonator realizations, both distributed and lumped, that can be used to realize a suitable shunting resonant mode. As such, the illustration in FIG. 11 is only exemplary.

The oscillating signal output is located on the left in FIG. 11, where the schematically shown load 1101 may be the TWPA input into which the output signal of the oscillator is coupled as a pumping signal. The load 1101 may also be the input of a power combiner or directional coupler that is used to combine the oscillating signal with an input signal directed to the TWPA.

Depending on the particular embodiment, the pumping power required by a TWPA may be in the range of 10 pW–1 nW. The power generated by the oscillator should match this requirement. An order-of-magnitude estimate of the power generated by a Josephson oscillator is $VI_c$, where V is the voltage across the Josephson junction and $I_c$ is the critical current of the junction. It follows from the well-known Josephson relation that $V=\Phi_0 f$, where $\Phi_0 \approx 2.07\times 10^{-15}$ Wb is the flux quantum and f is the generated frequency. In FIG. 11, the generated frequency f is close to the characteristic frequency $\omega_r/2\pi$ of the shunting resonator. As f, and thus the requirement for $\omega_r$, comes from the frequency range requirements of the qubit system being exited or read out, the power range of the oscillator can be determined by design, through the selection of the critical current $I_c$. For a typical case with f=5 GHz, one can derive that choosing the critical current from the range of 1 µA-100 pA fulfills the criterion of output power to match the typical required pumping power 10 pW–1 nW of a TWPA. This range of critical currents is achievable with the Josephson junction technologies, which are compatible with TWPA fabrication.

A more detailed description of a Josephson oscillator is provided in co-pending patent application number FI20195189, which is incorporated herein by reference. For a suitable bias current $I_b$, which has the same order of magnitude as the critical current, the junction synchronizes with the resonator and coherent radiation is emitted into the load 1101. The simulated time-resolved voltage emitted into the load resistor has been found to follow a clear sinusoidal behavior with the oscillation period close to $\omega_r/2\pi$.

The efficiency of power generation, expressed as, $\eta = \mathcal{P}_{out}/\mathcal{P}_{in}$, can be a significant fraction of unity for optimized device parameters. Thus, there are no significant power loading effects on top of the generated microwave signal. With typical TWPA power requirement ranges, as listed above, and with typical cryostat cooling capacities (e.g. 10 pW at 20 mK), one can integrate up to thousands or even hundreds of thousands of oscillators without being limited by the thermal capacity of the cryostat. In this respect, the approach can be expected to exceed the state of art in the scalability of cryogenic microwave frequency applications.

Figure 12:
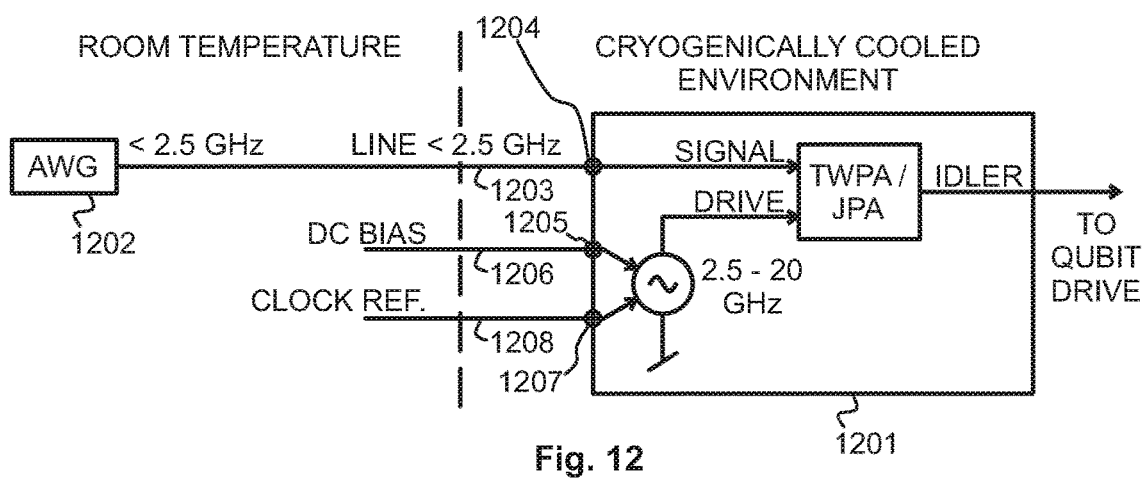
FIG. 12 illustrates a more detailed way to produce excitation signals for qubits.

FIG. 12 illustrates an example embodiment of a system or an arrangement for generating excitation signals for qubits in a cryogenically cooled environment. The cryogenically cooled environment is located on the right in the drawing, and comprises at least one cryogenic integrated circuit or integrated module 1201. A simplified graphical representation is shown in FIG. 12. The at least one cryogenic integrated circuit or integrated module 1201 may have, for example, any of the internal configurations described earlier with reference to FIGS. 4, 6, 7, 8, 9, and/or 10. For example, even if only one oscillator and only one TWPA is shown in FIG. 12, the cryogenic integrated circuit or integrated module 1201 may comprise two or more oscillators and/or two or more TWPAs, and these may be interconnected in various ways, as was described earlier with reference to FIGS. 4, 6, 7, 8, 9, and 10.

A waveform generator 1202 is located outside the cryogenically cooled environment. In the embodiment of FIG. 12, the waveform generator 1202 is located in the room temperature environment. Here, and also in the following example embodiments, the characterizations of the cryogenically cooled environment and the room temperature environment may be similar to what was explained earlier with reference to FIG. 2. The system or arrangement includes a signal line 1203 from the waveform generator 1202 to a signal input 1204 of the cryogenic integrated circuit or integrated module 1201. The waveform generator 1202 may be configured to generate and to convey into the signal line 1203 waveforms at frequencies smaller than 2.5 GHz. According to an advantageous embodiment, the waveform generator 1202 may be configured to generate and to convey into the signal line 1203 waveforms at frequencies smaller than 1.5 GHz.

The cryogenic integrated circuit or integrated module 1201 includes a biasing input 1205 configured to couple biasing signals into the oscillator(s) comprised therein. Typical biasing signals include DC biasing voltages and currents, where the expression DC should be taken to mean constant-value signals or signals that change only very slowly in relation to the oscillation frequencies of the oscillating signals involved. DC biasing signals may be pulsed, which means that during an active pulse the biasing signal is essentially constant at a first value and between pulses it is essentially constant at a second value that may be zero. A DC bias source of any suitable kind may be located outside the cryogenically cooled environment. A DC bias line 1206 may be provided from the DC bias source to the DC biasing input 1205 of the cryogenic integrated circuit or integrated module 1201. If there are two or more oscillators or other parts of the cryogenic integrated circuit or integrated module 1201 that can be controlled with biasing, there may be two or more DC bias lines from the DC bias source to respective DC biasing inputs of the cryogenic integrated circuit or integrated module 1201.

Additionally, the cryogenic integrated circuit or integrated module 1201 is shown to include a clock reference input 1207 configured to couple reference clock signals into the oscillator(s) comprised therein. Typical clock reference signals are carefully stabilized oscillating signals at some accurately known reference frequency and phase. Advantageous exemplary arrangements for providing clock reference signals from a room temperature environment to a cryogenically cooled environment are disclosed in co-pending EP Patent Application No. EP20156207.1, incorporated herein by reference.

A clock reference source of any suitable kind may be located outside the cryogenically cooled environment. A clock reference line 1208 may be provided from the clock reference source to the clock reference input 1207 of the cryogenic integrated circuit or integrated module 1201. If there are two or more oscillators or other parts of the cryogenic integrated circuit or integrated module 1201 that can utilize a reference clock signal, there may be two or more clock reference lines from the clock reference source to respective clock reference inputs of the cryogenic integrated circuit or integrated module 1201.

Above various solutions and arrangements have been described in which the up-converting characteristic of one or more TWPAs is utilized. The signal output of the cryogenic integrated circuit or integrated module is configured to convey or transmit output signals out of its amplifier output on an idler frequency or idler frequencies of the respective TWPA(s). It may be noted that the idler frequency is higher than the initial input signal frequency if the pumping frequency is higher than the initial input signal frequency. However, the operation of a TWPA is symmetrical in the sense that if the pumping frequency is lower than the initial input signal frequency, the idler frequency becomes a mirror image of the last-mentioned but on the other, lower side of the pumping frequency. In other words, it is possible to use a TWPA also as a down-converter. Some advantageous ways of utilizing this property are described below.

Figure 13:
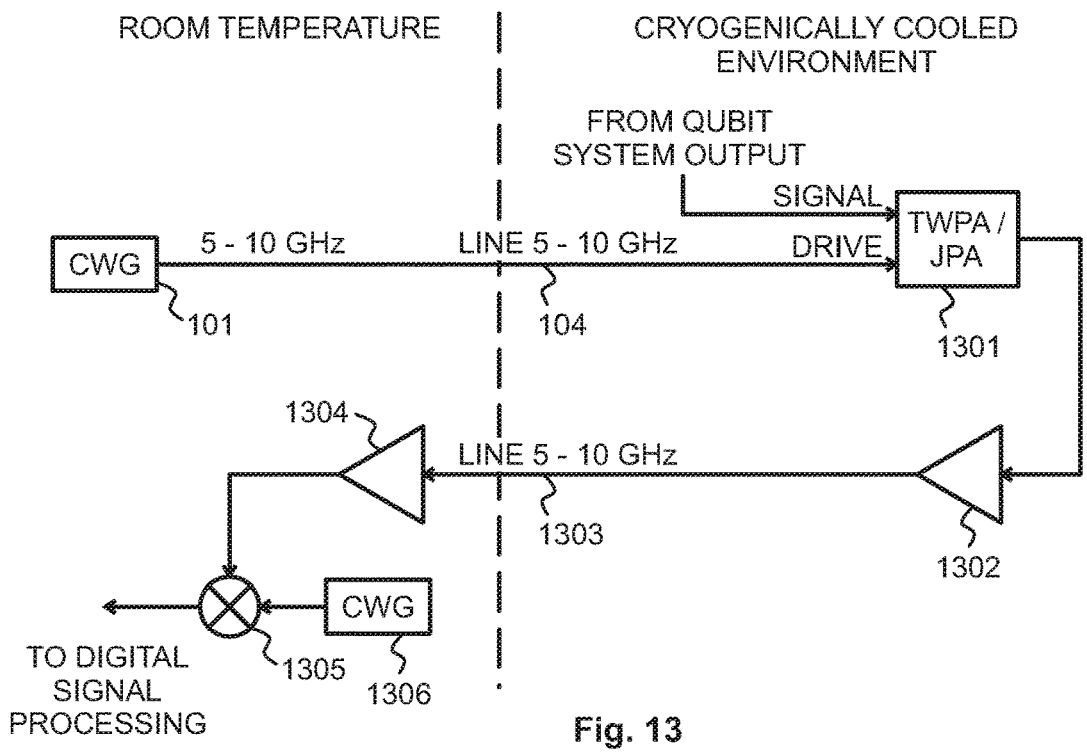
FIG. 13 illustrates a known arrangement for extracting output signals from qubits for signal processing.

FIG. 13 illustrates a known way of extracting qubit output signals from a quantum computing system located in a cryogenically cooled environment. As in FIG. 1 earlier, a carrier wave generator (CWG) 101 is located in the room temperature environment and generates a carrier wave signal, the frequency of which may be between 5 and 10 GHz. A signal line 104 carries the carrier wave signal from the room temperature environment to the cryogenically cooled environment, where it is used as the drive signal or pumping frequency signal of a TWPA 1301. Qubit output signals from a quantum computing system (not shown) are coupled into the amplifier signal input of the TWPA. The task of the TWPA is to amplify the qubit output signals and to produce a corresponding amplified signal, which in the known arrangement of FIG. 13 is provided at the pumping frequency. This amplified signal in the frequency range between 5 and 10 GHz is provided to a cryogenic preamplifier 1302, and from an output of the amplifier 1302 through a signal line 1303 out of the cryogenically cooled environment.

In the room temperature environment, the signal coming through the signal line 1303 may be further amplified by an amplifier 1304, after which it is down-converted in a mixer 1305 using a mixing frequency provided from a carrier wave generator 1306. The resulting down-converted signal is then provided to digital signal processing to utilize the information it conveys. This information originated in the quantum computing system in the cryogenically cooled environment.

The known arrangement shown in FIG. 13 shares the drawbacks that were described above in reference to FIG. 1. The known arrangement requires two signals lines capable of carrying very high frequency signals (for example in the range between 5 and 10 GHz) between the room temperature environment and the cryogenically cooled environment. As quantum computing systems become larger with more and more qubits, the number of very high frequency signal lines increases respectively, which makes the system complicated to construct.

Figure 14:
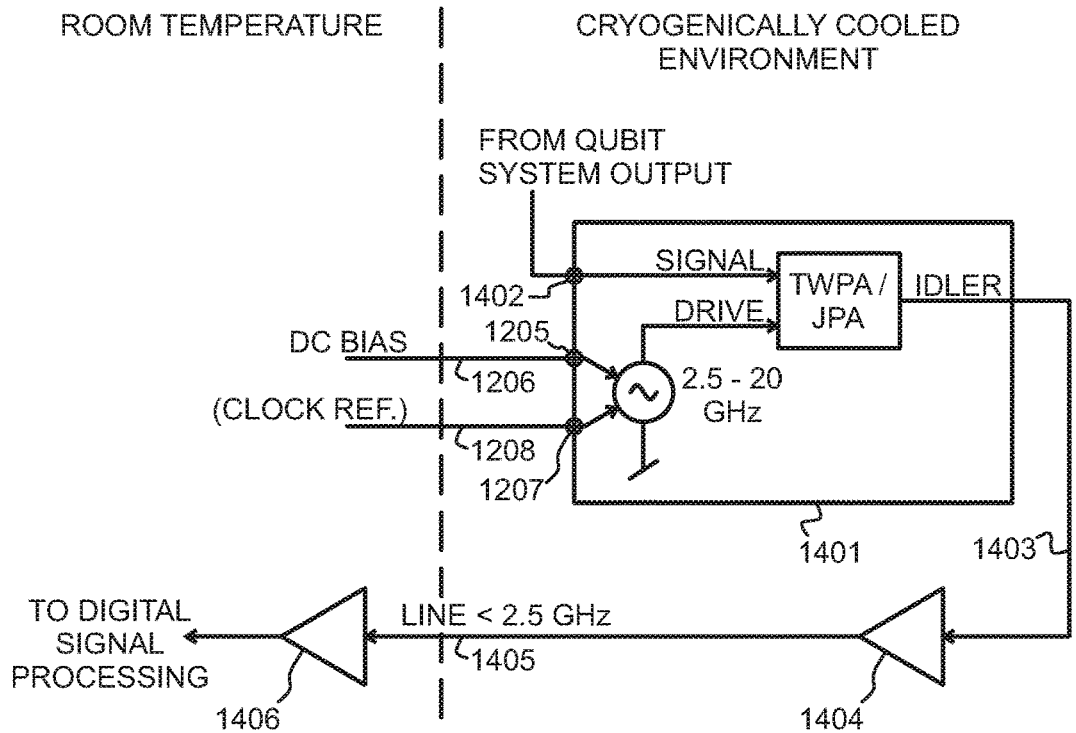
FIG. 14 illustrates an example embodiment of processing output signals from qubits.

FIG. 14 illustrates a more advantageous arrangement for extracting qubit output signals from a quantum computing system located in a cryogenically cooled environment. The arrangement comprises at least one cryogenic integrated circuit or integrated module 1401. The at least one cryogenic integrated circuit or integrated module 1401 may have, for example, any of the internal configurations described earlier with reference to FIGS. 4, 6, 7, 8, 9, and/or 10. For example, even if only one oscillator and only one TWPA is shown in FIG. 14, the cryogenic integrated circuit or integrated module 1401 may comprise two or more oscillators and/or two or more TWPAs, and these may be interconnected in various ways as was described earlier with reference to FIGS. 4, 6, 7, 8, 9, and 10.

A biasing input 1205, a DC bias line 1206, a clock reference input 1207, a clock reference line 1208, a DC bias source, and a clock reference source may be located in the room temperature environment. These components may be similar to what has been described above with reference to FIG. 12. However, instead of using any signal line from outside the cryogenically cooled environment, there is a coupling from the quantum computing system into the signal input 1402 of the cryogenic integrated circuit or integrated module 1401.

Output signals from the TWPA(s) in the cryogenic integrated circuit or integrated module 1401 are provided at the idler frequency of the TWPA(s). A signal line 1403 is provided from a signal output of the cryogenic integrated circuit or integrated module 1401 through a cryogenic preamplifier 1404 to a processing system that is outside the cryogenically cooled environment. A first amplifier 1406 of the processing system is shown in FIG. 14. Both the cryogenic preamplifier 1404 and the signal line 1405 out of the cryogenically cooled environment only need to be optimized for operation on a much lower frequency than in the system of FIG. 13. Here, an exemplary characterization of the frequency being lower than 2.5 GHz is given. In an advantageous embodiment, the frequency may be lower than 1.5 GHz. This is because the signal output of the cryogenic integrated circuit or integrated module 1401 is configured to convey the output signals from the TWPA amplifier output on an idler frequency of the respective TWPA. The idler frequency is, in this case, smaller than the frequency of the qubit output signals from the quantum computing system.

Figure 15:
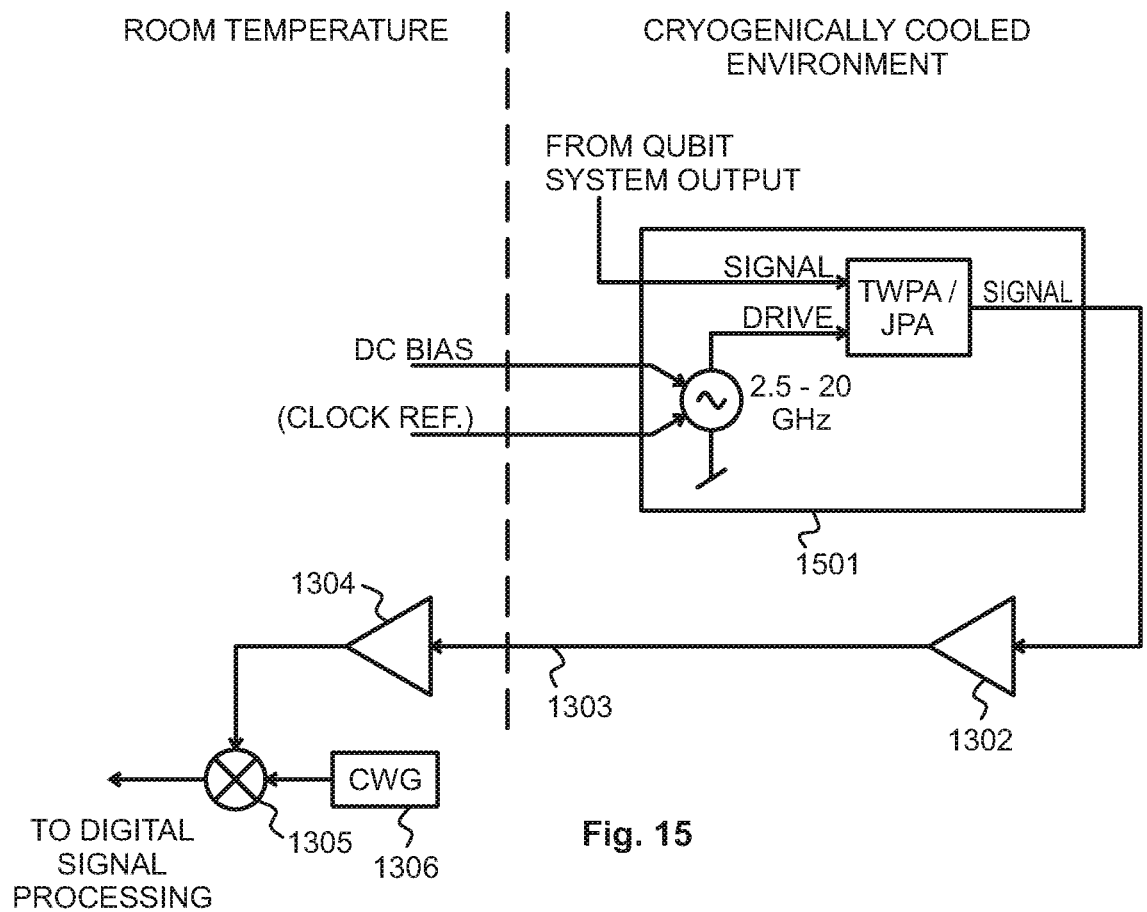
FIG. 15 illustrates a variation of the principle of FIG. 14.

As such, it is also possible to utilize the advantageous properties of a cryogenic integrated circuit or integrated module of a kind described above in a system that the idler frequency is not used at the TWPA output. FIG. 15 illustrates an embodiment that is otherwise similar to that of FIG. 14, but the signal output of the cryogenic integrated circuit or integrated module 1501 is configured to convey the output signals from the amplifier output of the respective TWPA at an output frequency that is the same as a frequency of the qubit output signals from the quantum computing system. The signal path out of the cryogenically cooled environment is now similar to that in FIG. 13. However, for example, if an advantageous parallel configuration like that in FIG. 9 is used in the cryogenic integrated circuit or integrated module 1501, advantages may still be gained by multiplexing outputs from several qubits into a common signal path out of the cryogenically cooled environment. This provides a benefit by eliminating the need to feed the TWPA drive signal from the room temperature embodiment, where some simplification in the system is achieved.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A cryogenic integrated circuit or integrated module comprising:
   an amplifier including a travelling wave parametric amplifier or a Josephson parametric amplifier, the amplifier including at least one amplifier input and an amplifier output;
   an oscillator configured to produce an oscillating drive signal, the oscillator connected to the at least one amplifier input for providing the oscillating drive signal into the amplifier;
   a signal input configured to couple input signals into the amplifier through the at least one amplifier input;
   a biasing input configured to couple biasing signals into the oscillator; and
   a signal output configured to convey output signals from the amplifier output out of the cryogenic integrated circuit or integrated module,
   wherein the amplifier, the oscillator, the signal input, the biasing input, and the signal output are incorporated into the cryogenic integrated circuit or integrated module and configured for operation in a cryogenically cooled environment.

2. The cryogenic integrated circuit or integrated module according to claim 1, further comprising:
   a directional coupler or power combiner including a first coupler input, a second coupler input, and a coupler output,
   wherein the first coupler input is coupled to the signal input, the second coupler input is coupled to the oscillator, and the coupler output is coupled to the at least one amplifier input.

3. The cryogenic integrated circuit or integrated module according to claim 1, wherein the at least one amplifier input includes an amplifier signal input and an amplifier drive input, and
   wherein the signal input is configured to couple the input signals into the amplifier through the amplifier signal input, and the oscillator is configured to couple the oscillating drive signal into the amplifier drive input.

4. The cryogenic integrated circuit or integrated module according to claim 1, further comprising a clock reference input configured to couple reference clock signals into the oscillator.

5. The cryogenic integrated circuit or integrated module according to claim 4, further comprising a frequency multiplier coupled between the clock reference input and the oscillator.

6. The cryogenic integrated circuit or integrated module according to claim 5, further comprising a band-pass filter coupled between the frequency multiplier and the oscillator.

7. The cryogenic integrated circuit or integrated module according to claim 1, wherein the amplifier and the oscillator are monolithically integrated onto a common substrate.

8. The cryogenic integrated circuit or integrated module according to claim 1, further comprising a clock reference input configured to couple reference clock signals into the oscillator, and
   wherein the amplifier and the oscillator are monolithically integrated onto a common substrate, and a frequency multiplier is monolithically integrated onto the common substrate together with the amplifier and the oscillator.

9. The cryogenic integrated circuit or integrated module according to claim 8, further comprising a band-pass filter coupled between the frequency multiplier and the oscillator, and
wherein the frequency multiplier and the band-pass filter are monolithically integrated onto the common substrate together with the amplifier and the oscillator.

10. The cryogenic integrated circuit or integrated module according to claim 1, wherein the amplifier is located on a first chip and the oscillator is located on a second chip, and
wherein the first and second chips are integrated together through a bonding method including at least one of wire bonding or flip-chip-bonding.

11. The cryogenic integrated circuit or integrated module according to claim 1, wherein the amplifier is located on a first chip and the oscillator is located on a second chip, and
wherein the first and second chips are separately packaged devices in a common functionally connected module that constitutes the cryogenic integrated circuit or integrated module.

12. The cryogenic integrated circuit or integrated module according to claim 1, wherein the amplifier is a first amplifier, the at least one amplifier input is at least one first amplifier input, the amplifier output is a first amplifier output, the oscillator is a first oscillator, and the oscillating drive signal is a first oscillating drive signal, further comprising:
a second amplifier including a travelling wave parametric amplifier or a Josephson parametric amplifier, the second amplifier comprising at least one second amplifier input and a second amplifier output,
a second oscillator configured to produce a second oscillating drive signal, the second oscillator connected to the at least one second amplifier input for providing the second oscillating drive signal into the second amplifier,
wherein the first amplifier output is coupled to the at least one second amplifier input, and
wherein the second amplifier output is coupled to the signal output.

13. The cryogenic integrated circuit or integrated module according to claim 1, wherein the amplifier is a first amplifier, the at least one amplifier input is at least one first amplifier input, the amplifier output is a first amplifier output, the signal input is a first signal input, and the input signals are first input signals, further comprising:
a second amplifier including a travelling wave parametric amplifier or a Josephson parametric amplifier, the second amplifier comprising at least one second amplifier input and a second amplifier output, and
a power divider or directional coupler configured to divide the oscillating drive signal into both the at least one first amplifier input and the at least one second amplifier input.

14. The cryogenic integrated circuit or integrated module according to claim 13, further comprising:
a second signal input configured to couple second input signals into the second amplifier through the at least one second amplifier input; and
a power combiner including a first combiner input, a second combiner input, and a combiner output,
wherein the first amplifier output is coupled to the first combiner input, the second amplifier output is coupled to the second combiner input, and the combiner output is coupled to the signal output.

15. The cryogenic integrated circuit or integrated module according to claim 13, wherein the oscillator is a first oscillator and the oscillating drive signal is a first oscillating drive signal,
further comprising a second oscillator configured to produce a second oscillating drive signal,
wherein each of the first amplifier and the second amplifier includes a two-stage cascaded amplifier where each stage is a travelling wave parametric amplifier or a Josephson parametric amplifier,
wherein the first oscillator is configured to convey the first oscillating drive signal to first stages of each of the first and second amplifiers, and
wherein the second oscillator is configured to convey the second oscillating drive signal to second stages of each of the first and second amplifiers.

16. The cryogenic integrated circuit or integrated module according to claim 13, wherein the signal output is a first signal output and the output signals are first output signals,
further comprising a second signal output configured to convey second output signals from the second amplifier output.

17. The cryogenic integrated circuit or integrated module according to claim 1, wherein the signal output is configured to convey the output signals from the amplifier output out on an idler frequency of the respective travelling wave parametric amplifier or the Josephson parametric amplifier.

18. A system for generating excitation signals for qubits in a cryogenically cooled environment, the system comprising:
at least one cryogenic integrated circuit or integrated module that is located within the cryogenically cooled environment;
a waveform generator that is located outside the cryogenically cooled environment; and
a signal line connected to the waveform generator and a signal input of the cryogenic integrated circuit or integrated module,
wherein the cryogenic integrated circuit or integrated module includes:
an amplifier including a travelling wave parametric amplifier or a Josephson parametric amplifier, the amplifier comprising at least one amplifier input and an amplifier output;
an oscillator configured to produce an oscillating drive signal, the oscillator connected to the at least one amplifier input for providing the oscillating drive signal into the amplifier;
the signal input configured to couple input signals into the amplifier through the at least one amplifier input;
a biasing input configured to couple biasing signals into the oscillator; and
a signal output configured to convey output signals from the amplifier output out of the cryogenic integrated circuit or integrated module.

19. The system according to claim 18, wherein the waveform generator is configured to:
generate waveforms at frequencies smaller than 2.5 GHz; and
convey the waveforms into the signal line.

20. The system according to claim 18, further comprising:
a DC bias source located outside the cryogenically cooled environment; and
a DC bias line connected to the DC bias source and a DC biasing input of the cryogenic integrated circuit or integrated module, or first and second DC bias lines connected to the DC bias source and respective DC biasing inputs of the cryogenic integrated circuit or integrated module.

21. The system according to claim 18, further comprising:
a clock reference source located outside the cryogenically cooled environment; and
a clock reference line connected to the clock reference source and a clock reference input of the oscillator, or first and second clock reference lines connected to the clock reference source and respective clock reference inputs of the oscillator and a second oscillator.

22. A system for extracting qubit output signals from a quantum computing system located in a cryogenically cooled environment, the system comprising:
at least one cryogenic integrated circuit or integrated module within the cryogenically cooled environment;
a coupling from the quantum computing system into a signal input of the cryogenic integrated circuit or integrated module; and
a signal line connected to a signal output of the cryogenic integrated circuit or integrated module through a cryogenic preamplifier to a processing system outside the cryogenically cooled environment,
wherein the cryogenic integrated circuit or integrated module comprises:
an amplifier including a travelling wave parametric amplifier or a Josephson parametric amplifier, the amplifier comprising at least one amplifier input and an amplifier output;
an oscillator configured to produce an oscillating drive signal, the oscillator connected to the at least one amplifier input for providing the oscillating drive signal into the amplifier;
the signal input configured to couple input signals into the amplifier through the at least one amplifier input;
a biasing input configured to couple biasing signals into the oscillator; and
the signal output configured to convey output signals from the amplifier output out of the cryogenic integrated circuit or integrated module.

23. The system according to claim 22, wherein the signal output is configured to convey the output signals from the amplifier output out of the cryogenic integrated circuit or integrated module on an idler frequency of the respective travelling wave parametric amplifier or the Josephson parametric amplifier, the idler frequency being smaller than a frequency of the qubit output signals from the quantum computing system.

24. The system according to claim 22, wherein the signal output is configured to convey the output signals from the amplifier output out of the cryogenic integrated circuit or integrated module on an output frequency of the respective travelling wave parametric amplifier or the Josephson parametric amplifier, the output frequency being the same as a frequency of the qubit output signals from the quantum computing system.

\* \* \* \* \*